United States Patent [19]

Chiang

[11] Patent Number: 5,167,724
[45] Date of Patent: Dec. 1, 1992

[54] PLANAR PHOTOVOLTAIC SOLAR CONCENTRATOR MODULE

[75] Inventor: Clement J. Chiang, New Brunswick, N.J.

[73] Assignee: The United States of America as represented by the United States Department of Energy, Washington, D.C.

[21] Appl. No.: 700,813

[22] Filed: May 16, 1991

[51] Int. Cl.$^5$ .................. H01L 31/052; H01L 31/048
[52] U.S. Cl. ...................................... 136/246; 136/251
[58] Field of Search ............................... 136/246, 251

[56] References Cited

U.S. PATENT DOCUMENTS

| | | | |
|---|---|---|---|
| 4,042,417 | 8/1977 | Kaplow et al. | 136/246 |
| 4,083,097 | 4/1978 | Anagnostou et al. | 437/2 |
| 4,097,308 | 6/1978 | Klein et al. | 136/251 |
| 4,235,643 | 11/1980 | Amick | 136/246 |
| 4,281,208 | 7/1981 | Kuwano et al. | 136/249 |
| 4,332,973 | 6/1982 | Sater | 136/246 |
| 4,348,546 | 9/1982 | Little | 136/256 |
| 4,692,557 | 9/1987 | Samuelson et al. | 136/251 |
| 4,834,805 | 5/1989 | Erbert | 136/246 |

OTHER PUBLICATIONS

S. L. Levy, Conf. Record, 17th IEEE Photovoltaic Specialists Conference, (1984), pp. 814–819.

D. Carroll, "Alpha Solarco's High-Concentration Photovoltaic Array Development Program", 20th IEEE Photovoltaic Specialists Conference, 1988, pp. 1138–1143.

N. Kaminar et al., "19% Concentrator Module Efficiency Using Single-Junction GaAs Cells", 18th IEEE Photovoltaic Specialists Conference, 1985, pp. 1159–1162.

E. Richards, "Sandia's Baseline 3 Photovoltaic Concentrator Module", 20th IEEE Photovoltaic Specialists Conference, 1988, pp. 1318–1323.

R. Donovan et al., "Ten Kilowatt Photovoltaic Concentrating Array", 13th IEEE Photovoltaic Specialists Conference, 1978, pp. 1125–1130.

J. Sanders et al., "Design Considerations and Performance Characteristics of High Concentration Point-focussing Photovoltaic Modules", 17th IEEE Photovoltaic Specialist Conference, 1984, pp. 799–804.

V. Erbert, "Short Focal Length Concentrating Photovoltaic Collector", 20th IEEE Photovoltaic Specialists Conference, 1988, vol. 2, pp. 1144–1148.

P. Logan, "Solar Electric Plans to Mass-Produce PV System", Albuquerque Journal Business Outlook, p. 4, Sep. 1, 1986.

Primary Examiner—Aaron Weisstuch
Attorney, Agent, or Firm—Karla Ojanen; James H. Chafin; William R. Moser

[57] ABSTRACT

A planar photovoltaic concentrator module for producing an electrical signal from incident solar radiation includes an electrically insulating housing having a front wall, an opposing back wall and a hollow interior. A solar cell having electrical terminals is positioned within the interior of the housing. A planar conductor is connected with a terminal of the solar cell of the same polarity. A lens forming the front wall of the housing is operable to direct solar radiation incident to the lens into the interior of the housing. A refractive optical element in contact with the solar cell and facing the lens receives the solar radiation directed into the interior of the housing by the lens and directs the solar radiation to the solar cell to cause the solar cell to generate an electrical signal. An electrically conductive planar member is positioned in the housing to rest on the housing back wall in supporting relation with the solar cell terminal of opposite polarity. The planar member is operable to dissipate heat radiated by the solar cell as the solar cell generates an electrical signal and further forms a solar cell conductor connected with the solar cell terminal to permit the electrical signal generated by the solar cell to be measured between the planar member and the conductor.

18 Claims, 4 Drawing Sheets

PLANAR PHOTOVOLTAIC SOLAR CONCENTRATOR MODULE

The United States Government has rights in this invention pursuant to Contract No. DE-AC04-76DP00789 awarded by the U.S. Department of Energy to American Telephone and Telegraph Company.

BACKGROUND OF THE INVENTION

The present invention relates generally to a photovoltaic concentrator module for converting incident solar radiation to electricity and, more particularly, to a planar photovoltaic concentrator module having improved safety and reliability, improved producibility and manufacturability, and improved performance characteristics.

A photovoltaic solar concentrator module typically utilizes a lens to concentrate solar radiation onto a solar cell assembly which, in turn, converts the solar radiation into electricity. The solar cell assembly is precisely located at the bottom of a metal or plastic housing. The assembly and the housing are collectively referred to as the module. In practice, multiple solar cell assemblies are located in the housing and are electrically configured to form a module operable to generate an electrical signal having a magnitude sufficient to, for example, charge a battery or operate electrically powered equipment.

Although photovoltaic concentrator modules presently available have been used with some success, their use has not been trouble free. Typically, because of the low voltages and the high currents generated by solar cells under intense solar concentration, the solar cells of a photovoltaic concentrating solar module are electrically connected in series. Therefore, the cells must be electrically insulated from each other. Also, to increase their efficiency, the cells must be effectively cooled. Ideally, the solar cell circuit would be encapsulated in a module housing made of an inexpensive material that has low electrical conductivity, high thermal conductivity, and simple processing. Diamond and certain highly purified semiconducting materials have low electrical conductivity and high thermal conductivity. Certain ceramic materials have low electrical conductivity and moderately high thermal conductivity. However, all these materials are expensive and not easily processed.

Another problem experienced with presently available photovoltaic concentrator modules results from the use of metal contacts, metal heat spreaders, and metal heat sinks to conduct electricity and to dissipate heat from the solar cells which form "portions"—regions—of the solar cell assemblies. Because of the high electrical currents generated by typical solar cells under appreciable solar concentration, the areas of the electrical contacts must necessarily be large to reduce electrical resistance losses. Heat dissipation is desirable because it reduces the temperature of the solar cells thereby increasing efficiency. Heat spreaders conduct heat laterally away from the solar cell to reduce the intensity of this heat before it passes through materials with low thermal conductivity. Then, heat sinks convect and radiate this heat to the atmosphere. Because of the low effectiveness of passive air cooling, the area of each solar cell assembly heat sink is comparable to the illuminated area of its associated lens. In all known photovoltaic concentrator modules, past and present, some or all of these metal components are exposed either inside or outside the module housing, which poses serious safety and reliability problems, especially in the presence of moisture. Complete insulation of solar cell assemblies and heat sinks has not yet been accomplished in a satisfactory manner because of the sheer size of these components and because it is presently believed that heat sinks must be exposed to atmosphere to provide adequate cooling. It is known to employ thin plastic or ceramic films to insulate electrical contacts from heat spreaders and to insulate heat spreaders from heat sinks if the solar cell assembly is to be positioned in a metal housing; however, the performance and reliability of plastic and ceramic films has proven to be marginal.

Production of concentrator modules has proven to be difficult, costly, and time-consuming because of the use of bulky and expensive metal or plastic housings and the difficulties of handling fragile and bulky cell assemblies and of accurately positioning the cell assemblies within these housings. Bulkiness of the assemblies can be reduced by mounting the solar cell array on a plane as in U.S. Pat. No. 4,834,805, entitled "Photovoltaic power modules and methods for making same," to Erbert, issued on May 30, 1989.

In addition to the problems caused by moisture, heat, and production difficulties in presently used photovoltaic concentrator modules, concentrator modules are known to experience additional problems because of solar cell assembly/lens misalignment when metal housings are used to encase the solar cell assemblies. As previously mentioned, solar cell assemblies are typically configured in an array and a corresponding array of plastic lenses concentrates solar radiation onto the solar cell assemblies. The solar cell assemblies are mounted on the back wall of the module housing and the plastic lenses form the front wall of the housing. If a metal housing is used to encase the solar cell assemblies, a problem arises because of the differences in the thermal and moisture-induced expansion between the plastic lens array and the metal housing. These differences in thermal and moisture-induced expansion cause misalignment between the solar cell assemblies and the lenses, which reduces the amount of solar radiation directed toward the solar cells themselves. This obviously results in a reduction in the amount of electricity generated by the solar cell assemblies. In extreme cases, this misalignment may cause the lenses to physically separate from the housing, allowing moisture to freely enter the housing. This will damage the solar cells and electrical connections located within the housing.

If a plastic housing is used to encase the solar cell assemblies, problems arise because the seals around openings in the housing allowing exposure of metal heat sinks are unreliable. Moreover, housings are expensive to develop and produce because of their requirement for high dimensional accuracy, and because the cell assemblies must be laboriously mounted and fastened within these housings.

Consequently, a need exists for an improved photovoltaic concentrator module which overcomes the shortcomings of the prior art. In particular, there is a need for a photovoltaic concentrator module which is resistant to moisture and dirt and configured to allow the solar cell assemblies and heat sinks to be fully insulated without adversely affecting the module's heat dissipation. Additionally, a need exists for an improved photovoltaic concentrator module that is easier to produce than the prior art and whose performance is less sensitive to differences in temperature than the prior art.

SUMMARY OF THE INVENTION

The present invention relates to a planar photovoltaic concentrator module designed to satisfy the aforementioned needs. More particularly, the photovoltaic concentrator module of the present invention includes a solar cell assembly having a construction which permits it and its heat sink, which forms an integral part of the assembly, to be completely enclosed in a sealed plastic housing. Encapsulating the solar cell assembly in a plastic resin and incorporating it into the housing to form the photovoltaic concentrator module prevents assembly moisture damage and eliminates the electrical and safety problems associated with exposing the assembly heat sink to the atmosphere. Further, production difficulties are overcome by the use of planar cell assemblies, by the use of the heat spreader/heat sinks themselves as a means of locating the cell assemblies underneath the lens elements, and by the use of a resin, not only as an encapsulant, but also structurally, as the back wall of the module.

Accordingly, the present invention is directed to a planar photovoltaic concentrator module for producing an electrical signal from incident solar radiation, which comprises at least one solar cell assembly enclosed within four side walls encapsulated by a layer of resin which provides mechanical support, but also covers elements of the solar cell assemblies to a sufficient depth with the refractive optical element of the solar cell assembly protruding from the resin, and at least one optical lens, in relationship with said solar cell assembly, positioned onto the enclosure and supported by the walls, the purpose of the lens to focus incident solar radiation onto said solar cell thereby generating electricity by creating a voltage between elements of the solar cell assembly. The invention further comprises the solar cell assembly having a solar cell with a substantial center region of one polarity separated from a perimeter region of opposite polarity by an insulating region; an electrically and thermally conductive spacer electrically and mechanically fixed to the center region of the solar cell; a planar member mechanically and electrically connected to the conductive spacer; a planar conductor mechanically and electrically connected to the perimeter region of the solar cell; insulating material interposed between the planar member and the planar conductor; an insulating sheet upon which the planar member is accurately positioned; a refractive optical element positioned on top of the solar cell, all positioned within the enclosed housing as described above.

Improved safety and reliability are obtained by completely encapsulating the cell assemblies in a plastic resin, making them impervious to moisture and other potentially harmful materials such as dust. The resin also effectively protects the fragile cell assemblies from damage. Occasional cleaning, if needed, could be accomplished by flushing the housing with water. The prior art does not have these features.

Improved producibility and manufacturability are obtained by the invention in three ways; first, the invention uses the plastic resin not only as an encapsulant but also using it structurally, as the back wall of the module. The back wall of the prior art does not perform the function of encapsulating the cell assemblies. A second improvement is precisely locating the cell assemblies on the planar members, which also are of precise dimensions. Then, by accurately positioning the planar members with respect to each other, proper spacing of the cell assemblies underneath the lens elements is easily accomplished. The plastic resin is then poured into the housing, and when the resin cures and hardens, the spacing of the cell assemblies is fixed. Alternatively, a suitable plastic resin could be injection molded around the cell assemblies. The prior art requires special fixtures for positioning the cell modules in the back wall of bulky and expensive prefabricated metal or plastic housings. These fixtures often must remain in place while the bonding agent or adhesive used to attach the cell assemblies to the back wall of the housing cures or stiffens. The third improvement to production of the invention is to employ thin planar cell assembly components that are easy to fabricate and assemble into thin cell assemblies that can be completely encapsulated within a thin layer of resin. These three improvements in producibility and manufacturability are key features of the invention.

Improved performance is obtained by using separate planar members suspended in the resin of the back wall of the housing. Because the thermal expansion rate of the resin is similar to the thermal expansion rate of the lens elements, proper spacing of the cell assemblies relative to the lens elements is maintained, regardless of temperature. In the prior art, the cell assemblies are mounted on a back wall typically made of metal, with a different thermal expansion rate than the plastic material of the lens parquet. At different temperatures, misalignment of the cell assemblies relative to the lens elements causes sunlight to miss the cells thereby decreasing electrical power generation.

The invention has been demonstrated to overcome these challenges without compromising heat dissipation characteristics. The prior art employed insulating materials between metal heat spreaders and metal heat sinks and believed it necessary to expose the metal heat sinks to the atmosphere for adequate heat dissipation. A novel aspect of the invention useful in promoting heat dissipation is the use of the planar members both as heat spreaders and as heat sinks. Electrical insulation between the module and its surroundings is then effectively obtained by the back wall of the module, which is a sheet of electrically nonconducting material commonly used as the back wall of non-concentrating solar modules.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the course of the following detailed description, reference will be made to the attached drawings in which.

DETAILED DESCRIPTION OF THE INVENTION

In the course of the following description, like reference characters designate like or corresponding parts throughout the several views. Also in the following description, it is to be understood that such terms as "forward", "rearward", "left", "right", "upwardly", "downwardly", and the like, are words of convenience and are not to be constructed as limiting terms.

Figure 1:
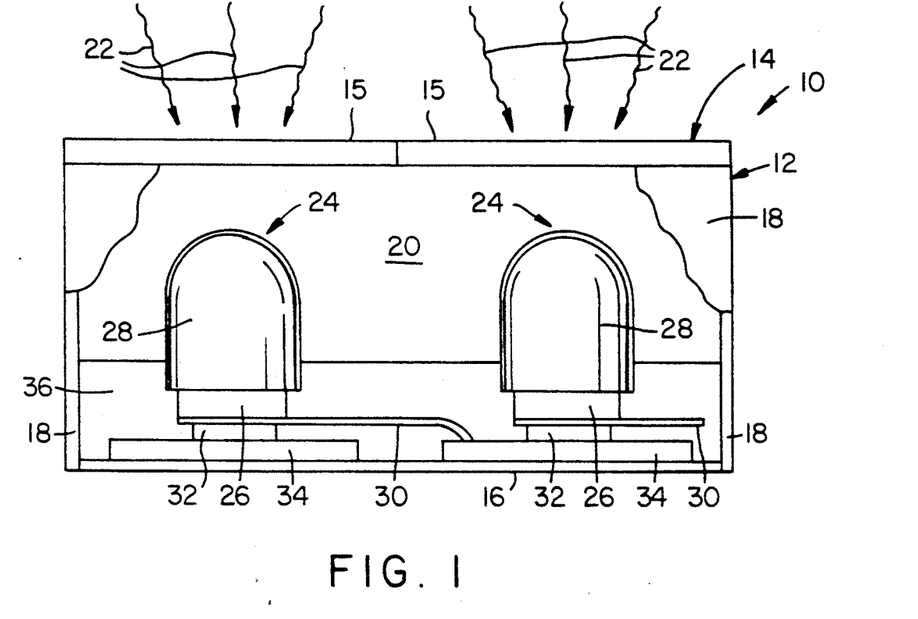
FIG. 1 is a side elevational view of the photovoltaic concentrator module of the present invention, illustrating a pair of solar cell assemblies positioned within the hollow interior of the module housing.

Referring now to the drawings, and particularly to FIG. 1, there is shown a view in side elevation of the photovoltaic concentrator assembly of the present invention generally designated by the numeral 10. The photovoltaic concentrator module 10 has a construction which provides improved heat dissipation and moisture resistance characteristics over photovoltaic concentrator modules presently known and utilized.

The photovoltaic concentrator module 10 of the present invention includes a housing 12 having a front wall 14 and an opposing back wall 16. A plurality of side walls 18 extend between the front wall 14 and the back wall 16 and define a hollow interior 20 of the housing 12. As will be explained later in greater detail, the front wall 14 of the housing 12 is formed from one or more lenses 15, preferably Fresnel lenses made of plastic to direct solar radiation, schematically represented by the numerals 22, incident to the front wall 14 into the hollow interior 20 of the housing 12.

A pair of solar cell assemblies 24 are positioned within the hollow interior 20 of the housing 12 to rest on the housing back wall 16. It should be understood that although a pair of solar cell assemblies 24 are illustrated in FIG. 1, any number of assemblies 24 may be positioned within the hollow interior 20 of the housing 12. However, each solar cell assembly 24 utilized should be positioned beneath its own lens 15 in order to maximize the amount of solar radiation received by each assembly. In this manner, the amount of electricity generated by the photovoltaic concentrator module 10 is also maximized.

As seen in FIG. 1, each solar cell assembly 24 includes a solar cell 26 to generate an electrical signal proportional to the amount of solar radiation received. A refractive optical element 28 is positioned in contact with the solar cell 26 and is bonded to the solar cell 26 with a silicone adhesive material which is highly transparent and retains its tight-bond capacity under high light intensity, and those skilled in the art will understand that the silicone adhesive, under these circumstances, has low reflective properties to direct the light onto the solar cell 26. The refractive optical element 28 receives solar radiation directed into the interior 20 of the housing 12 by the lens 15 and optically directs the received solar radiation to the solar cell 26. The refractive optical element 28 is preferably made of quartz because it has high light transmission characteristics and does not degrade from the high solar irradiance intensity. However, the refractive optical element 28 may also be made of "Pyrex" if desired. Although "Pyrex" absorbs more solar radiation than quartz and is thus not as efficient, "Pyrex", however, can be chemically etched to reduce surface reflection losses and thereby increase its transmission. The refractive optical element 28 and the lens 15 are, preferably, an optically matched pair with respect to focal length and diameter. The purpose of the "matched pair" is to be used as primary and secondary concentrators which provide uniform light distribution onto the solar cell 26 even under varying solar alignment conditions.

The solar cell 26 of each solar cell assembly 24 includes both electrical terminals (not shown in FIG. 1). One terminal of each solar cell 26 is connected with a planar conductor 30. The terminal having opposite polarity of each solar cell 26 is electrically connected with an electrically conductive spacer 32. The conductor 30 is physically spaced from the spacer 32 to prevent the solar cell 26 from short-circuiting. The electrically conductive spacer 32 is disposed on an electrically conductive planar member 34 which is, in turn, disposed on the back wall 16 of the housing 12. With this arrangement, the electrically conductive planar member 34 of each solar cell assembly 24 mechanically supports the assembly's spacer 32, conductor 30, solar cell 26 and refractive optical element 28. In addition to providing mechanical support for the remainder of the components forming each assembly 24, the electrically conductive planar member 34 of each assembly 24 forms the output conductor for the assembly's solar cell 26 because it is electrically connected with the spacer 32. The spacer 32 is electrically connected with the terminal of the solar cell 26. Thus, the electrical signal generated by each solar cell assembly 24 of each solar cell 26 is measurable between the assembly's electrically conductive planar member 34 and the assembly's conductor 30. As seen in FIG. 1, multiple solar cell assemblies 24 may be electrically connected in series by connecting the conductor 30 of one solar cell assembly 24 to the electrically conductive planar member 34 of an adjacent solar cell assembly 24. The total number of solar cell assemblies 24 utilized to form the photovoltaic concentrator module 10 is selected based on the maximum amount of electricity capable of being generated by a single solar cell assembly 24 and the desired overall electrical signal to be generated by the photovoltaic concentrator module 10.

In addition to providing mechanical support for the assembly 24 and serving as an electrical conductor for the assembly's solar cell 26, the electrically conductive planar member 34 of each assembly 24 also operates as the assembly's heat spreader and heat sink for dissipating heat released by the solar cell 26 as the solar cell 26 generates electricity. Utilizing planar member 34 as the heat sink for the assembly 24 eliminates the need for a heat sink mounted external to the housing 12 and thus reduces the hazards involved with heat sinks exposed to atmosphere. Finally, locating the planar member 34 within the interior 20 of the housing 12 eliminates the need to provide openings in the side walls 18 or back wall 16 of the housing 12 for receiving heat conducting connective members extending between the solar cell 26 and the planar member 34 as would otherwise be necessary if the heat sink, in the form of the planar member 34, was located exterior to the housing 12. The thickness of the planar member 34 is chosen based on heat transfer calculations to give sufficient heat spreading for subsequent heat dissipation through the back wall of the housing 16.

The refractive optical element 28, solar cell 26, electrical conductor 30, spacer 32 and planar member 34 of each solar cell assembly 24 positioned within the interior 20 of the housing 12 are encapsulated in a clear plastic resin material 36, as shown in FIG. 1, to ensure that each solar cell assembly 24 remains in fixed position within the housing 12. It is important that each solar cell assembly 24 remains fixed to eliminate the possibility of misalignment between the refractive optical element 28 of each assembly 24 and the lens 15 associated with each assembly 24. The resin is of sufficient thickness and stiffness to function as the back of the housing.

Figure 2:
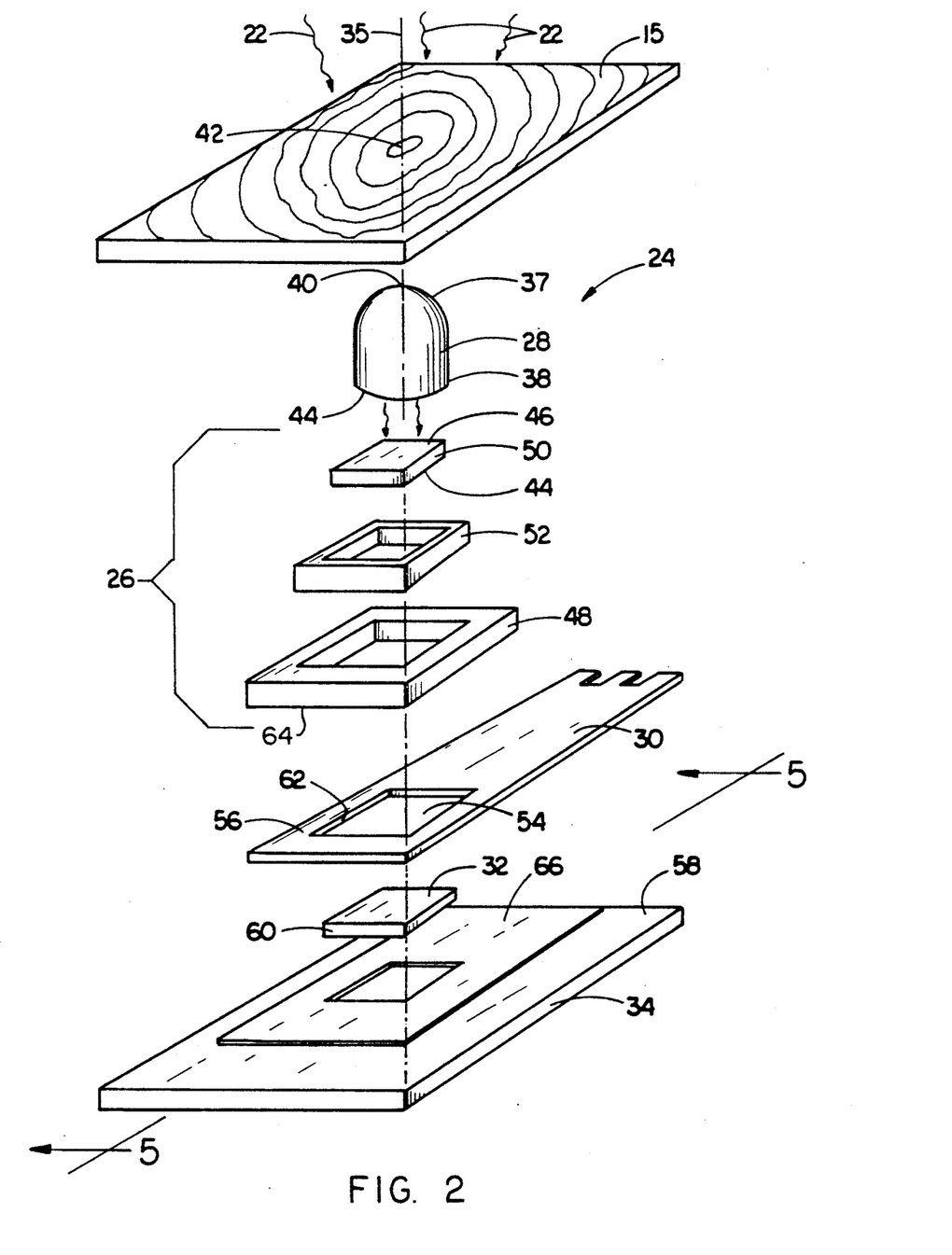
FIG. 2 is an exploded, perspective view of one of the solar cell assemblies illustrated in FIG. 1.

Now referring to FIG. 2, there is illustrated an exploded, perspective view of a solar cell assembly 24 and its associated lens 15 as shown in FIG. 1. As seen in FIG. 2, the refractive optical element 28 of the solar cell assembly 24 includes a domed upper portion 37 and a cylindrical lower portion 38. The center 40 of the refractive optical element 28 domed upper portion 38 is aligned with the center 42 of the lens 15, as indicated by the dotted line 35, to provide that the refractive optical element 28 receives the maximum amount of solar radiation directed into the interior 20 of the housing 12 by the lens 15. The cylindrical lower portion 38 of the refractive optical element 28 has a diameter selected to provide that the lower surface 44 of the refractive optical element 28 completely covers the facing upper surface 46 of the solar cell 26 upon assembly. The curvature and height of the refractive optical element 28 are calculated to give optimum distribution of light on the solar cell 26, even when the module 10 is not pointed directly at the sun.

The solar cell 26 of the solar cell assembly 24 is made from high resistivity, single crystal silicon and includes a cell outer perimeter region 48 which defines an electrical terminal of the solar cell. The solar cell 26 further includes a cell center region 50 which defines another electrical terminal of the solar cell. An electrically insulating region 52 is interposed between the cell outer perimeter region 48 and the cell center region 50 to electrically insulate the solar cell terminals 50, 48 from each other and thereby prevent the solar cell 26 from short circuiting. Other types of cells could be used equally well, including those with contacts on opposite surfaces of the cell and those made from other semiconductor materials.

As further seen in FIG. 2, the conductor 30 has an opening 54 therethrough to define a conductor outer perimeter region 56. The size of the opening 54 is selected to provide that the conductor outer perimeter region 56 is in registry with cell outer perimeter region 48 when the conductor 30 is secured to the solar cell 26. In this manner, the conductor 30 is electrically connected with the terminal of the solar cell 26 to provide a solar cell output terminal. It is important to note that the size of the opening 54 is selected to provide that the conductor outer perimeter region 56 is electrically insulated from the solar cell electrically insulating portion 52 or the cell center region 50 upon assembly. The conductor 30 outer perimeter portion 56 is secured to the cell outer perimeter region 48 with tin-silver solder. The conductor 30 may be stamped from a thin sheet of copper, or may be fabricated from copper sheet by electron discharge machining (EDM). The fingers of conductor 30 are designed to relieve stress caused by different rates of thermal expansion between the solar cells, 26, the conductor 30, the cell assemblies 24, and the plastic resin 36.

The electrically conductive spacer 32 is disposed on the upper surface 58 of the electrically conductive planar member 34. The configuration and size of the spacer's outer side wall 60 is selected to provide that the spacer 32 fits within the opening 54 formed through the conductor 30 and thus does not touch the side wall 62 defining the opening 54 when the spacer 32 is secured to the bottom surface 64 of the solar cell 26. In addition, the thickness of the spacer 32 must be greater than the thickness of the conductor 30 to ensure that the conductor 30 does not contact the upper surface 58 of the electrically conductive planar member 34 upon assembly.

Figure 3:
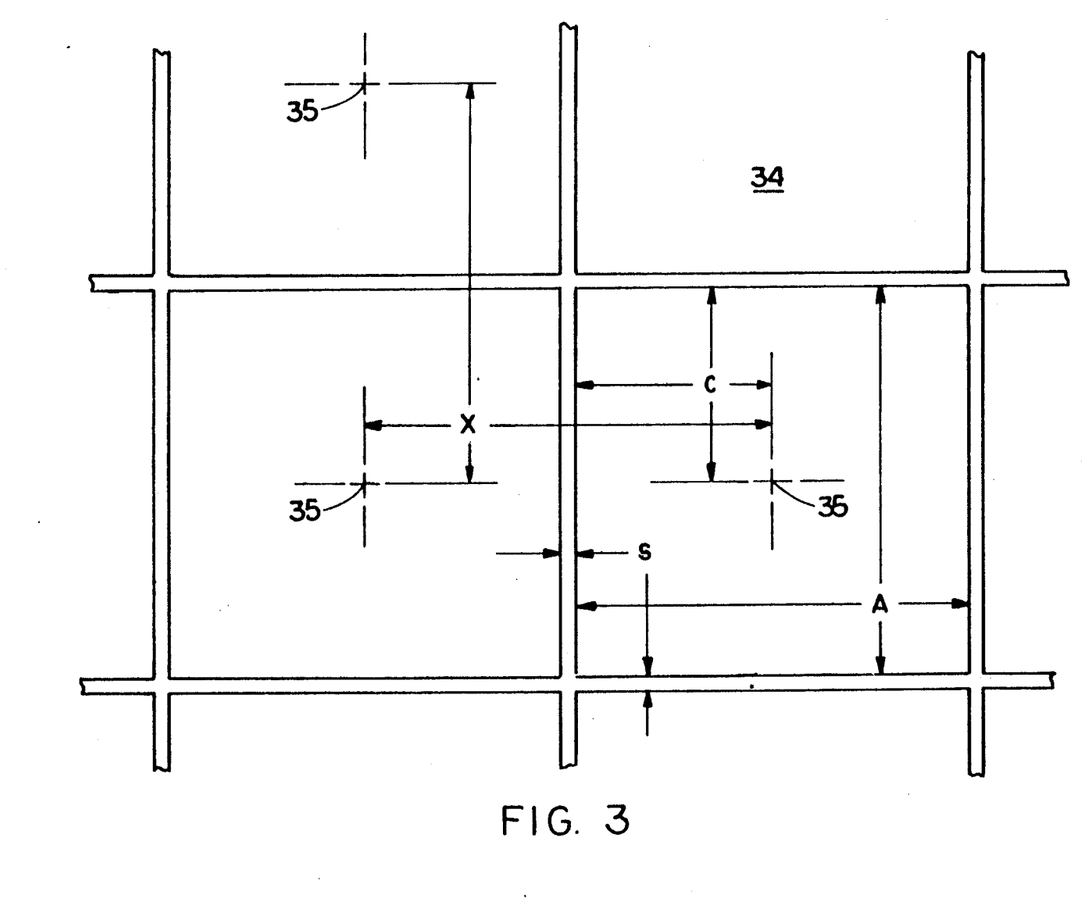
FIG. 3 is a top plan view of the solar cell planar members which further illustrates the dimensions for which precision is required.

As previously described, with the spacer 32 in contact with both the cell center region 50 and the electrically conductive planar member 34, the planar member 34 operates as a terminal of the solar cell 26. This arrangement permits an electrical signal generated by the solar cell to be measured between the planar member 34 and the conductor 30. The spacer 32 is mechanically and electrically secured to both the cell center region 50 and the planar member 34 with tin-lead-silver solder which has a different melting point that the tin-silver solder which secures the conductor outer perimeter region to the cell outer perimeter region. As with the conductor 30, the spacer 32 and planar member 34 may each be stamped from a thin sheet of copper, or may be fabricated from copper sheet by electron discharge machining (EDM). The precise dimensions of the planar members 34 and the precise location of the solar cells 26 on the planar members 24, facilitate proper spacing of the solar cells 26 in relation to the lens elements 15 by locating the planar members 34 at a constant spacing relative to each other. FIG. 3 illustrates the ease with which these precise dimensions can be maintained, by merely maintaining the precision of the planar member 34 dimension, indicated as "A" on the figure, the spacing between planar members 34, indicated as "s", and the dimensions to the center of each planar member 34, indicated as "c" on FIG. 3. Precision manufacturing of the solar cell assembly easily lends itself to automated or robotic assembly.

Finally, as seen in FIG. 2, a sheet of cloth 66, made from an electrically insulating material such as glass, is interposed between the conductor 30 and the upper surface 58 of the planar member 34. The sheet of glass cloth 66 provides electrical insulation between the conductor 30 and the planar member 34, which in turn prevents the solar cell's terminals 50, 48 from electrically short-circuiting as a result of the conductor 30 contacting the planar member 34.

Figure 4:
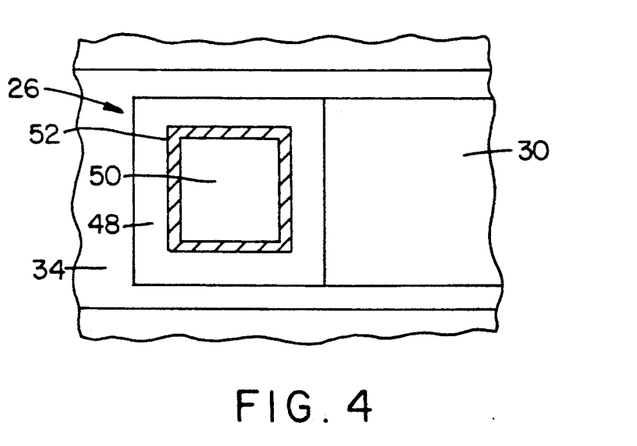
FIG. 4 is a top plan view of the solar cell, solar cell conductor and solar cell heat sink which form a part of the solar cell assembly illustrated in FIG. 2.

Now referring to FIG. 4, there is illustrated a top plan view of the solar cell 26 and portions of the conductor 30 and the planar member 34 of FIGS. 1 and 2. FIG. 4 clearly illustrates that the solar cell 26 is constructed to provide a cell outer perimeter region 48 which serves as the terminal of the solar cell, a cell center region 50 which serves as a terminal of the solar cell, and an electrically insulating region 52 interposed between the cell outer perimeter region 48 of one polarity and the cell center region 50 of opposite polarity to prevent the solar cell 26 from short-circuiting during operation. The solar cell 26 illustrated in FIG. 4 is square, but other shapes, e.g., rectangular, of solar cells 26 and lens elements 15 can be used.

Figure 5:
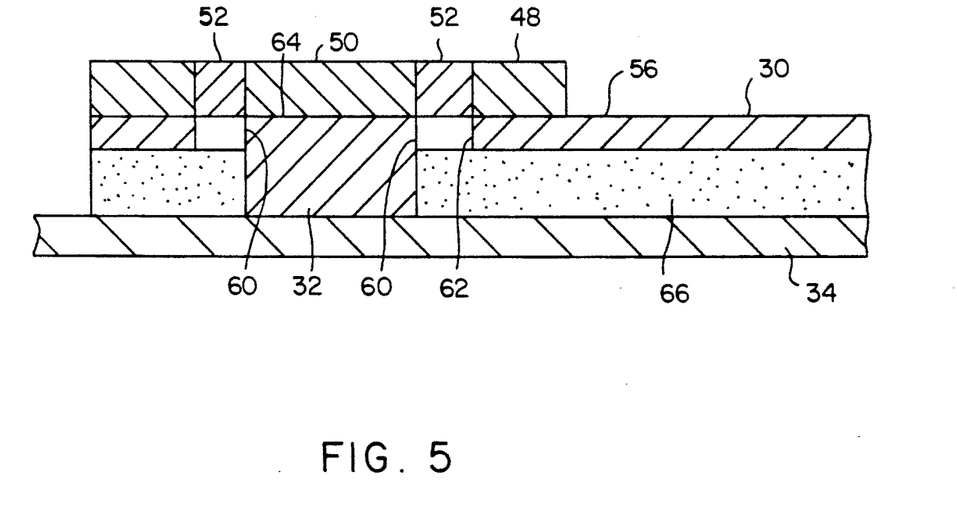
FIG. 5 is a cross-sectional view in side elevation of a portion of the solar cell assembly of FIG. 2.

Now referring to FIG. 5, there is illustrated a cross-sectional view in side elevation of a portion of the solar cell assembly 24 illustrated in FIG. 2. FIG. 5 illustrates how the electrical spacer 32 fits within the opening 54 formed in the conductor 30 to contact the lower surface 64 of the solar cell 26. As seen in FIG. 5, there is a gap between the side wall 62 of the conductor 30 which defines the opening 54 and the outer side wall 60 of the spacer 32. The gap electrically insulates the conductor 30 from the spacer 32. The spacer 32 completely spans the cell center portion 50 to provide full contact between the cell center portion 50 and the spacer 32. The glass cloth 66 surrounds the spacer 32 and electrically insulates the conductor 30 from the planar member 34. The conducfor 30 outer perimeter region 56 is in registry with and contacts the cell outer perimeter region 48 to connect the terminal of the solar cell 26 with the conductor 30.

As described herein, the construction of the photovoltaic concentrator module 10 of the present invention eliminates the hazards associated with exposed electrical conductors and heat sinks. By employing generally planar contacts, such as the conductor 30, and heat sinks, such as planar member 34, full insulation of the electrically conductive components forming the solar cell assembly 24 is accomplished by encapsulating these members in resin, preferably plastic resin 36 as illustrated in FIG. 1. It has been found through analysis and experimentation that exposed metal heat sinks are not necessary for adequate cooling, provided that adequate heat spreading is accomplished to reduce the intensity of heat before further dissipation of the heat through materials having low thermal conductivity.

For low volume production, the front wall 14, back wall 16 and side walls 18 of the housing 12, illustrated in FIG. 1, may be made from rectangular sheets of plastic joined either by an adhesive, solvent welding, or by extruded rubber channels. The back wall 16 is formed from aluminum foil interposed between thin sheets of "Tedlar". "Tedlar" is a white fluorocarbon material. This laminate of aluminum foil and "Tedlar" is widely used as a backing material of certain types of solar collectors (not concentrators). The aluminum foil prevents moisture from entering the housing 12. The "Tedlar" reflects sunlight reflected from the ground, thereby reducing the amount of heat that must be dissipated. Also, the emissivity of "Tedlar" is high, promoting heat dissipation by radiation. To form the back of the module 10, the cell assemblies 24 are first accurately located on the back wall 16 and held in place with an adhesive. Then a clear plastic resin 36 is poured around the cell assemblies 24, encapsulating them. The resin then hardens to provide mechanical stiffness to the housing 12 of the module 10.

For high volume production, the entire housing 12 may be molded or cast in one piece around the solar cell assemblies 24. Further, the lenses 15 forming the front wall 14 of the housing 12 could also be molded as part of the housing 12 to form a one-piece photovoltaic concentrator module 10.

It is thought that the present invention and many of its attendant advantages will be understood from the foregoing description and it will be apparent that various changes may be made in the form, construction and arrangement of the parts of the invention described herein without departing from the spirit and scope of the invention or sacrificing all of its material advantages, the forms hereinbefore described being merely preferred or exemplary embodiments thereof.

We claim:

1. A planar photovoltaic concentrator module for producing an electrical signal from incident solar radiation, comprising:

at least one solar cell assembly, said solar cell assembly further comprising
   (a) a solar cell having a substantial center region of one output voltage polarity separated from a perimeter region of opposite output voltage polarity by an insulating region;
   (b) an electrically and termally conductive spacer member electrically and mechanically fixed to said center region of said solar cell;
   (c) an electrically and thermally conductive planar member mechanically and electrically connected to said conductive spacer;
   (d) a planar conductor mechanically and electrically connected to said perimeter region of said solar cell;
   (e) insulating material interposed between said planar member and said planar conductor;
   (f) a back wall comprising an insulating sheet upon which said planar member is accurately positioned;
   (g) a refractive optical element positioned on top of said solar cell;
four side walls connected to and extending upwardly perpendicular to said insulating sheet to create a hollow enclosure defining a housing containing said solar cell assembly;
a layer of resin within said hollow enclosure to encapsulate said planar conductor, said solar cell, said planar member, and said spacer member, said resin being of sufficient depth to provide mechanical support with said refractive optical element protruding from said resin, and to further provide fixed positioning of said refractive optical element with respect to said solar cell;
at least one optical lens, in relationship with said solar cell assembly, positioned onto said enclosure to focus incident solar radiation onto said solar cell thereby generating electricity by creating a voltage between said planar conductor and said planar member, said resin, said optical lens, and said housing having substantially the same coefficient of thermal expansion.

2. A planar photovoltaic concentrator module, as in claim 1, comprising more than one of said solar cell assemblies; and said planar members of each of said assembly are insulated from each other and are electrically connected in series.

3. The planar photovoltaic concentrator module as recited in claim 2, wherein said insulating material interposed between said planar member and said planar conductor is glass cloth.

4. The planar photovoltaic concentrator module as recited in claim 2, wherein said planar conductor has an opening formed therethrough to define a conductor outer perimeter region to contact said perimeter region of said solar cell.

5. The planar photovoltaic concentrator module as recited in claim 4, wherein said electrically conductive spacer member is positioned on said electrically conductive planar member and is located within said opening in said conductor outer perimeter region to contact said solar cell center region to said planar member.

6. The planar photovoltaic concentrator module as recited in claim 5, wherein said electrically conductive planar member, spacer member, and planar conductor are each made of copper.

7. The planar photovoltaic concentrator module as recited in claim 4, wherein said conductor outer perimeter region is secured to said solar cell perimeter region with solder, and said electrically conductive spacer member is secured to said planar member and said solar cell center region with solder.

8. The planar photovoltaic concentrator module as recited in claim 7, wherein said solder which secures said conductor outer perimeter region to said cell outer perimeter region has a different melting point that said solder which secures said electrically conductive spacer member to said planar member and said solar cell center region.

9. The planar photovoltaic concentrator module as recited in claim 8, wherein said conductor outer perimeter region is secured to said solar cell perimeter region with tin-silver solder, and said electrically conductive spacer member is secured to said planar member and said solar cell center region with tin-lead-silver solder.

10. The planar photovoltaic concentrator module as recited in claim 2, wherein at least said electrically conductive planar member, planar conductor, and solar cell are encapsulated in a resin material to maintain said planar member, planar conductor, and solar cell in a fixed position within said housing with respect to said optical lens and to electrically insulate said planar conductor, said planar member, and said spacer member.

11. The planar photovoltaic concentrator module as recited in claim 2, wherein said back wall of said housing is formed from a sheet barrier to water vapor interposed between layers of insulating material.

12. The planar photovoltaic concentrator module as recited in claim 11, wherein said sheet barrier to water vapor is aluminum foil.

13. The planar photovoltaic concentrator module as recited in claim 1, wherein said resin material, said lens, and said housing is plastic.

14. The planar photovoltaic concentrator module as recited in claim 1, wherein said refractive optical element and said lens are an optically matched pair having corresponding focal length and corresponding diameters relative to each other.

15. The planar photovoltaic concentrator module as recited in claim 14, wherein said lens is a Fresnel lens.

16. The planar photovoltaic concentrator modules as recited in claim 14, wherein said refractive optical element is made of quartz.

17. The planar photovoltaic concentrator module as recited in claim 1, wherein said refractive optical element is secured to said solar cell with a highly transparent adhesive that retains its tight-bond capacity under high light intensity.

18. The planar photovoltaic concentrator module as recited in claim 17, wherein said adhesive is a silicone material.

* * * * *

UNITED STATES PATENT AND TRADEMARK OFFICE
CERTIFICATE OF CORRECTION

PATENT NO. : 5,167,724
DATED : DECEMBER 1, 1992
INVENTOR(S) : CLEMENT J. CHIANG

It is certified that error appears in the above-identified patent and that said Letters Patent is hereby corrected as shown below:

On the title page, item (75): Inventors, add Alexander B. Maish, Corrales, N.M.

Signed and Sealed this

First Day of February, 1994

Attest:

BRUCE LEHMAN

Attesting Officer     Commissioner of Patents and Trademarks